United States Patent [19]
Oda

[11] Patent Number: 6,149,047
[45] Date of Patent: Nov. 21, 2000

[54] DIE-BONDING MACHINE

[75] Inventor: Norio Oda, Shiga, Japan

[73] Assignee: NEC Corporation, Tokyo, Japan

[21] Appl. No.: 09/339,029

[22] Filed: Jun. 23, 1999

[30] Foreign Application Priority Data

Jun. 23, 1998 [JP] Japan .................................. 10-176014

[51] Int. Cl.$^7$ ............................... B23K 3/04; B23K 3/06; B23K 1/002; B23K 1/005; B23K 1/008
[52] U.S. Cl. ........................... 228/6.2; 228/45; 228/49.1; 228/56.5
[58] Field of Search ................................. 228/6.2, 39, 45, 228/49.1, 49.2, 49.5, 56.5, 214, 179.1; 29/33, 39

[56] References Cited

FOREIGN PATENT DOCUMENTS 1-152634 6/1989 Japan .
4-111330 4/1992 Japan .

*Primary Examiner*—Patrick Ryan
*Assistant Examiner*—Colleen Cooke
*Attorney, Agent, or Firm*—McGinn & Gibb, P.C.

[57] ABSTRACT

In a die-bonding machine for picking up a number of semiconductor pellets arranged in the form of a pellet array, one by one, to place a picked-up semiconductor pellet on a predetermined position, when an estimated X-direction coordinate position of the semiconductor pellet to be picked up in relation to the pellet supporting and displacing mechanism is assumed as being "x" by considering a center point of the pellet supporting and displacing mechanism as the origin of the coordinates in the X direction, the pellet supporting and displacing mechanism and the pellet picking-up and carrying mechanism are displaced so that an X-direction coordinate position PX of the pick-up position takes a position expressed by the following equation (1) and an X-direction coordinate position CX of the center point of the pellet supporting and displacing mechanism takes a position expressed by the following equation (2):

$$PX = Ax \quad (1)$$

$$CX = -(1-A)x \quad (2)$$

where $0 < A < 1$.

19 Claims, 4 Drawing Sheets

DIE-BONDING MACHINE

BACKGROUND OF THE INVENTION

1. Field of the Invention

The present invention relates to a die-bonding machine used in fabricating a semiconductor device.

2. Description of Related Art

Generally, a semiconductor device is fabricated by sequentially assembling a semiconductor pellet (simply called a "pellet" hereinafter) on a pellet mounting section (called a "land" hereinafter) of a supporting member such as a lead frame or a BGA (ball grid array) board, by means of a die-bonding machine.

Now, a die-bonding system widely used in the prior art will be described with reference to the drawings. FIG. 1 is a diagrammatic partial plan view illustrating the relation between a semiconductor wafer and a mechanism for feeding a supporting member such as a lead frame, and FIG. 2 is a diagrammatic side sectional view of the mechanism shown in FIG. 1.

The supporting member 1, such as the lead frame, having a land on which the pellet is to be mounted and on which a bonding agent such as a solder or a silver (Ag) paste was placed in a preceding step, is loaded on a rail 2, and intermittently fed and then stopped in a left-to-right direction in FIG. 1 (namely, in an X direction) by a feeding mechanism (not shown) so that the land is placed at a predetermined bonding position BP.

On the other hand, a number of pellets 3 obtained by dicing a wafer are adhered on a sheet (not shown) to maintain a geometrical arrangement before the wafer is divided into the pellets, and the sheet is fixed to a wafer ring 5. The wafer ring 5 is fitted into and held by a ring holder 6, which is supported by a supporting and displacing mechanism (not shown). This supporting and displacing mechanism can freely displace the ring holder 6 (and hence the pellets 3 adhered on the sheet) in the X direction and in a Y direction perpendicular to the X direction, and also can freely rotate the ring holder 6 (namely, it can displace in an angular direction (a θ direction)), so that a designated pellet is sequentially placed in a fixed pick-up position PP one by one. This fixed pick-up position PP is determined to be as near to the bonding position BP as possible, in the Y direction from the bonding position BP.

Furthermore, a camera 7 is located and fixed directly above the fixed pick-up position PP, and an image of the pellet located on the fixed pick-up position PP, is photographed by the camera 7 and processed by a processing system (not shown) to ascertain whether or not a bad mark exists, and whether or not an appearance abnormality such as a crack or a chipping exists, and also to confirm that the pellet is positioned in place on the fixed pick-up position PP. If the pellet photographed by the camera 7 was defective, the ring holder 6 is displaced by the supporting and displacing mechanism so that a next pellet is moved to the fixed pick-up position PP. If the next pellet is non-defective, the ring holder 6 is finely displaced by the supporting and displacing mechanism so that the next pellet is positioned precisely on the fixed pick-up position PP. A push-up pin 8 is provided under the ring holder 6, in substantial alignment with the camera 7 in a vertical line.

The die-bonding machine also includes a pick-up collet having a vacuum nozzle 4 provided at a lower tip end. The pick-up collet can be moved so that the vacuum nozzle 4 can be displaced in a vertical direction (namely, in a Z direction) and also in the Y direction, shown by a dotted line in FIG. 2.

Thus, when the pellet located on the fixed pick-up position PP is non-defective, the ring holder 6 is finely displaced by the supporting and displacing mechanism so that the pellet is positioned precisely on the fixed pick-up position PP. The vacuum nozzle 4 is displaced to suction up the pellet, and on the other hand, the push-up pin 8 is elevated to push up the pellet and to peel off the pellet from the adhering sheet fixed by the wafer ring 5. After the pellet is suctioned and held by the vacuum nozzle 4, the vacuum nozzle 4 is lifted up, and moved in the Y direction to a position directly above the bonding position BP, and then, is lowered so that the pellet sucked and held by the vacuum nozzle 4 is placed on the land of the supporting member 1. Thereafter, the vacuum nozzle 4 is released and then lifted up. Thus, the non-defective pellet is placed on the land of the supporting member 1.

In the prior art die-bonding machine constructed as mentioned above, the bonding position BP and the fixed pick-up position PP are located as near to each other as possible, so that the time for carrying the pellet 3 is shortened, with the result that a high speed die-bonding operation can be realized. To the contrary, a moving range of the ring holder 6 becomes a double of the diameter of the wafer, so that the machine becomes large in size. Recently, since the wafer diameter has become 8 inches or 12 inches, this problem has become even worse.

Under this circumstance, Japanese Patent Application Pre-examination Publication No. JP-A-01-152634, (an English abstract of which is available and the content of the English abstract is incorporated by reference in its entirety into this application) proposes a die-bonding machine, which is so configured to imaginarily divide a number of pellets held by the ring holder into four quadrants by two orthogonal straight lines, and to limit the moving range of the ring holder in the X and Y directions to the degree that the pellets included in only one quadrant can be placed on the fixed pick-up position, and on the other hand to rotate the ring holder by 90 degrees at each time the pick-up operation for one quadrant is completed, so that the pick-up operation is carried out quadrant by quadrant. In this proposed die-bonding machine, the moving range of the ring holder in the X and Y directions can be reduced to one and a half times the diameter of the wafer. Therefore, even the time for rotating the ring holder becomes wasteful, since all the other operations can be sped up, the die-bonding operation can be sped up in total.

However, since the direction of the pellets changes by the rotation of the ring holder, it is necessary to change the direction of the picked-up pellet in the course of carrying the picked-up pellet to the supporting member, excepting for a special pellet which is formed in symmetry. Therefore, it is required that the vacuum suction nozzle of the pellet picking-up and carrying mechanism is constructed to be rotatable so as to adjust the direction of the picked-up pellet in the course of carrying the picked-up pellet, or alternatively, a rotatable relay stage is provided and the pellet picking-up and carrying mechanism is controlled to carry the picked-up pellet to the rotatable relay stage so that the pellet put on the rotatable relay stage is rotated together with the rotatable relay stage to adjust the direction of the pellet and the direction-adjusted pellet is picked up by another vacuum nozzle and carried and located on the land of the supporting member by the second vacuum nozzle.

As seen from the above, in this prior art die-bonding machine, since the direction of the pellet is different from one pellet to another when the pellet is picked up, it is necessary to adjust the direction of the pellet in the course of carrying the picked-up pellet. This direction adjusting operation is different from one pellet to another, and therefore, control software becomes very complicated.

Furthermore, Japanese Patent Application Pre-examination Publication No. JP-A-04-111330, (an English abstract of which is available and the content of the English abstract is incorporated by reference in its entirety into this application), proposes another die-bonding machine which does not have the fixed pick-up position. In this second prior art die-bonding machine, the ring holder is rotatable about its center axis (namely, displaceable in the θ direction), but the position of the center axis is fixed both in the X direction and in the Y direction. The rotating operation of the ring holder is only for aligning the direction of each pellet, but when each pellet is picked up, the ring holder is not rotated. On the other hand, the camera is displaceable both in the X direction and in the Y direction, as to sequentially ascertain the defective/non-defective of the pellet and the position of the pellet. The vacuum suction nozzle of the pellet picking-up and carrying mechanism is movable all in the X direction, in the Y direction and in the Z direction to move to the pellet which was ascertained by the camera, to pick up the same pellet, to move in the X direction and in the Y direction so as to locate the picked-up pellet on a predetermined location. This Japanese patent publication has no description concerning the push-up pin, but if the push-up pin is provided, the push-up pin is required to move both in the X direction and in the Y direction to follow the displacement of the camera.

In this second prior art die-bonding machine, since the ring holder is fixed in the X direction and in the Y direction, and the moving range of the pellet suction nozzle of the pellet picking-up and carrying mechanism is substantially within the ring holder, the machine becomes smaller in size. However, since the pellet picking-up and carrying mechanism has to go to a remote position for picking up the pellet, the die-bonding operation becomes slow. Therefore, it is supposed that the second prior art die-bonding machine can be applied in only the case that a high speed die-bonding operation is not required because a step before the die-bonding step and a step after the die-bonding step in an in-line production line need a substantial time. For example, since the silver paste needs a long time for hardening, when a reflow oven becomes long for a high speed feeding, the second prior art die-bonding machine can be applied. Alternatively, when a wire bonding needs a long dime because of a large number of pins, it is sufficient if the die-bonding is carried out at a speed comparable to that of the wiring bonding, the second prior art die-bonding machine can be applied.

In any case, since the second prior art die-bonding machine remarkably lowers the die-bonding speed, the second prior art die-bonding machine cannot be applied generally.

SUMMARY OF THE INVENTION

Accordingly, it is an object of the present invention to provide a die-bonding machine which has overcome the above mentioned problems of the prior art.

Another object of the present invention is to provide a die-bonding machine having a relatively small size and a satisfactory die-bonding speed, by limiting the moving range of the ring holder to some degree and by fixing the pellet picking-up direction so that the pellet can be picked up by repeating the same movement and therefore control software becomes simple.

The above and other objects of the present invention are achieved in accordance with the present invention by a die-bonding machine for picking up a number of semiconductor pellets arranged in the form of a pellet array, one by one, to place a picked-up semiconductor pellet on a predetermined position, the die-bonding machine comprising:

a pellet supporting and displacing mechanism for supporting the number of semiconductor pellets arranged in the form of the pellet array, and for displacing the number of semiconductor pellets arranged in the form of the pellet array, in an X direction and in a Y direction; and a pellet picking-up and carrying mechanism having a pellet sucking means which can be displaced in the X direction, in the Y direction and in a X direction, for picking up one semiconductor pellet positioned on a pick-up position, from the number of semiconductor pellets supported by the pellet supporting and displacing mechanism, and for placing the picked-up semiconductor pellet on the predetermined position, the pick-up position being movable only in the X direction, wherein, considering a center point of the pellet supporting and displacing mechanism as the origin of the coordinates in the X direction, an estimated X-direction coordinate position of the semiconductor pellet to be picked up in relation to the pellet supporting and displacing mechanism is assumed as being "x", and considering a center position of an X-direction moving range of the pellet supporting and displacing mechanism as the origin of the coordinates, the pellet supporting and displacing mechanism and the pellet picking-up and carrying mechanism are displaced so that an X-direction coordinate position PX of the pick-up position takes a position expressed by the following equation (1) and an X-direction coordinate position CX of the center point of the pellet supporting and displacing mechanism takes a position expressed by the following equation (2):

$$PX = Ax \quad (1)$$

$$CX = -(1-A)x \quad (2)$$

where 0<A<1.

With the above arrangement, if "A" is set to be large, it is possible to make the moving range of the pellet supporting and displacing mechanism small, but, the moving range of the pick-up position becomes large, so that the distance of the pellet carried by the pellet picking-up and carrying mechanism correspondingly becomes long, with the result that the speed of the die-bonding operation becomes slow. Therefore, the value of "A" is determined by considering the above relation.

According to another aspect of the present invention, there is provided a die-bonding machine for picking up a number of semiconductor pellets arranged in the form of a pellet array, one by one, to place a picked-up semiconductor pellet on a predetermined position, the die-bonding machine comprising:

a pellet supporting and displacing mechanism for supporting the number of semiconductor pellets arranged in the form of the pellet array, and for displacing the number of semiconductor pellets arranged in the form of the pellet array, in an X direction and in a Y direction; and a pellet picking-up and carrying mechanism having a pellet sucking means which can be displaced in the X direction, in the Y direction and in a X direction, for picking up one semiconductor pellet positioned on a pick-up position, from the number of semiconductor pellets supported by the pellet supporting and displacing mechanism, and for placing the picked-up semiconductor pellet on the predetermined position, the pick-up position being movable in the X direction and in the Y direction, wherein, considering a center point of the pellet supporting and displacing mechanism as the origin of the coordinates in the X direction and in the Y direction, an estimated X-direction coordinate position and an estimated Y-direction coordinate position of the semiconductor pellet to be picked up in relation to the pellet supporting and displacing mechanism are assumed as being "x" and "y", respectively, and considering a center position of an X-direction and Y-direction moving range of the pellet supporting and displacing mechanism as the origin of the coordinates, the pellet supporting and displacing mechanism and the pellet picking-up and carrying mechanism are displaced so that an X-direction coordinate position PX and a Y-direction coordinate position PY of the pick-up position take a position expressed by the following equations (1) and (1A) and an X-direction coordinate position CX and a Y-direction coordinate position CY of the center point of the pellet supporting and displacing mechanism take a position expressed by the following equations (2) and (2A):

$$PX = Ax \quad (1)$$

$$PY = By \quad (1A)$$

$$CX = -(1-A)x \quad (2)$$

$$CY = -(1-B)y \quad (2A)$$

where 0<A<1, and 0<B<1.

In this arrangement, the moving range of the pellet supporting and displacing mechanism can be reduced both in the X direction and in the Y direction.

Furthermore, the predetermined position on which the picked-up semiconductor pellet is placed, is a die bonding position where a land of a supporting member such as a lead frame is positioned, or alternatively, a relay place where the picked-up semiconductor pellet is placed once for a precise positioning. The semiconductor pellets can be supplied by arranging only non-defective pellets on a chip tray in the form of an array, but in many cases, in a condition in which the semiconductor pellets are adhered on an adhering sheet to maintain a geometrical arrangement before the wafer is divided into the pellets. In this case, the semiconductor pellets adhered on the adhering sheet include non-rectangle pellets and defective pellets applied with a bad mark.

The number of semiconductor pellets arranged in the form of the pellet array are loaded on the pellet supporting and displacing mechanism, which can displace the number of semiconductor pellets arranged in the form of the pellet array, in the X direction and in the Y direction, so as to position one pellet on the pick-up position. When the pellets packed on a chip tray are loaded on the pellet supporting and displacing mechanism, the pellet supporting and displacing mechanism may include only an XY table. When the pellets adhered on the adhering sheet are supplied, the sheet is fixed to a wafer ring, which is then fitted into and held by a ring holder. The ring holder is loaded on the pellet supporting and displacing mechanism. In this case, the pellet supporting and displacing mechanism is preferred to comprise not only the XY table but also a rotating mechanism for adjusting the direction of the pellets by rotating the ring holder.

The pick-up position can reciprocate at least in the X direction, but may reciprocate both in the X direction and in the Y direction. The pick-up position is such that the pellet placed on the pick-up position is picked up. For example, when the pellets are supplied with the chip tray, namely when the positional precision of the pellets is high, and furthermore, when the picked-up pellets are carried to a relay place for positioning, it is not necessary to ascertain whether or not the pellet is non-defective, and to ascertain the position of the pellet. However, when it is necessary to precisely position the pellet on the pick-up position, a position ascertaining means becomes necessary. In addition, when the pellets supplied include defective pellets, a means for discriminating whether or not the pellet is non-defective is necessary. For this purpose, a camera can be located above the pick-up position, and an image photographed by the camera is image-processed. Furthermore, a push-up pin can be located under the pick-up position for pushing up the pellet to peel off the pellet from the adhering sheet when the pellet is picked up. Of course, the camera and the push-up pin are movable in at least the X direction, or alternatively both in the X direction and in the Y direction.

Assuming that a pellet arrangement pitch is "1X", the pick-up position is sequentially displaced by a pitch of "A1X", and interlocking with the displacement of the pick-up position, the pellet is displaced by a pitch of "-(1-A)1X" by means of the pellet supporting and displacing mechanism so that the pellet is positioned to a new pick-up position. Thus, the moving range of the pellet supporting and displacing mechanism can be reduced to (1-A) times. This is also true in the Y direction. For example, "A"="B"=½.

The above and other objects, features and advantages of the present invention will be apparent from the following description of preferred embodiments of the invention with reference to the accompanying drawings.

DESCRIPTION OF THE PREFERRED EMBODIMENTS

Figure 3:
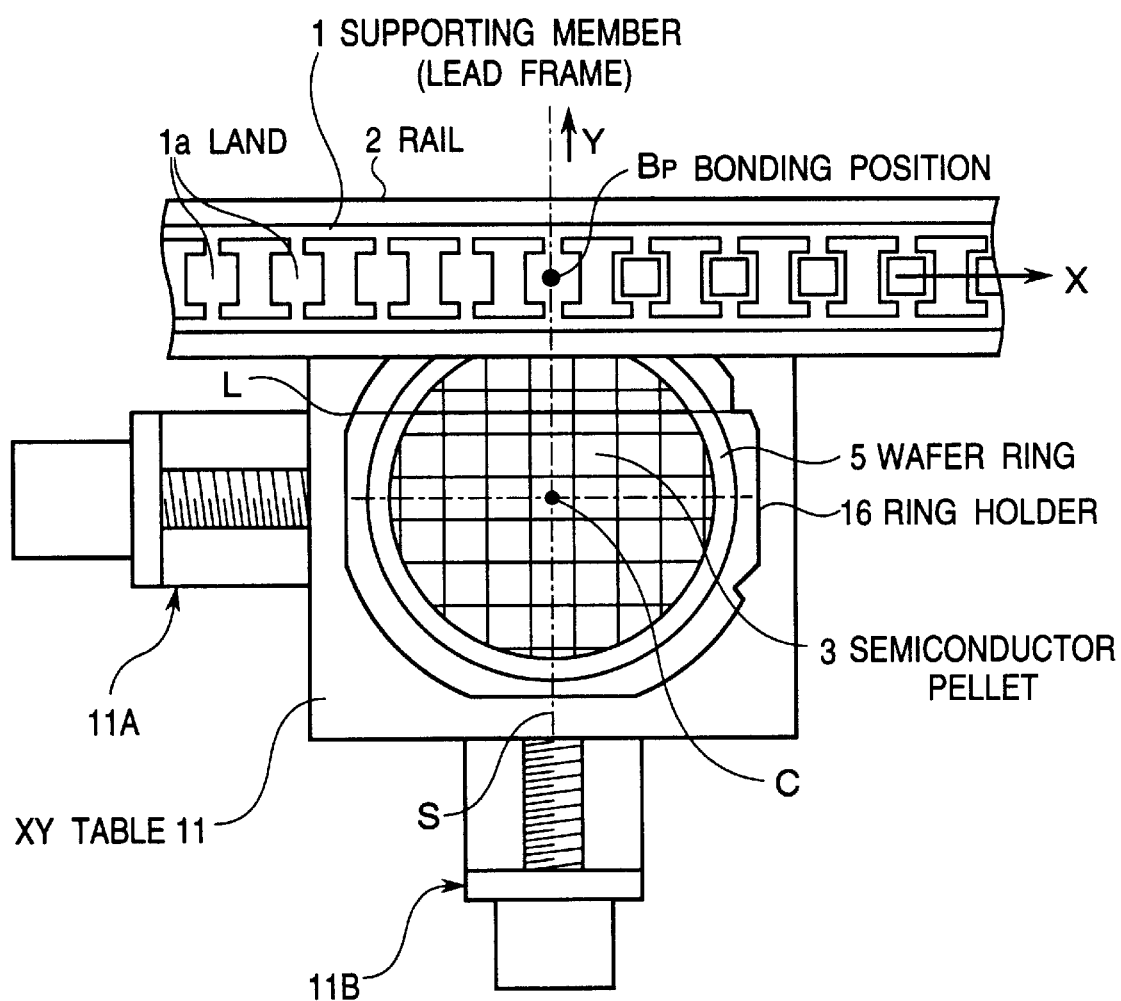
FIG. 3 is a diagrammatic plan view of a first embodiment of the die-bonding machine in accordance with the present invention.
Figure 4:
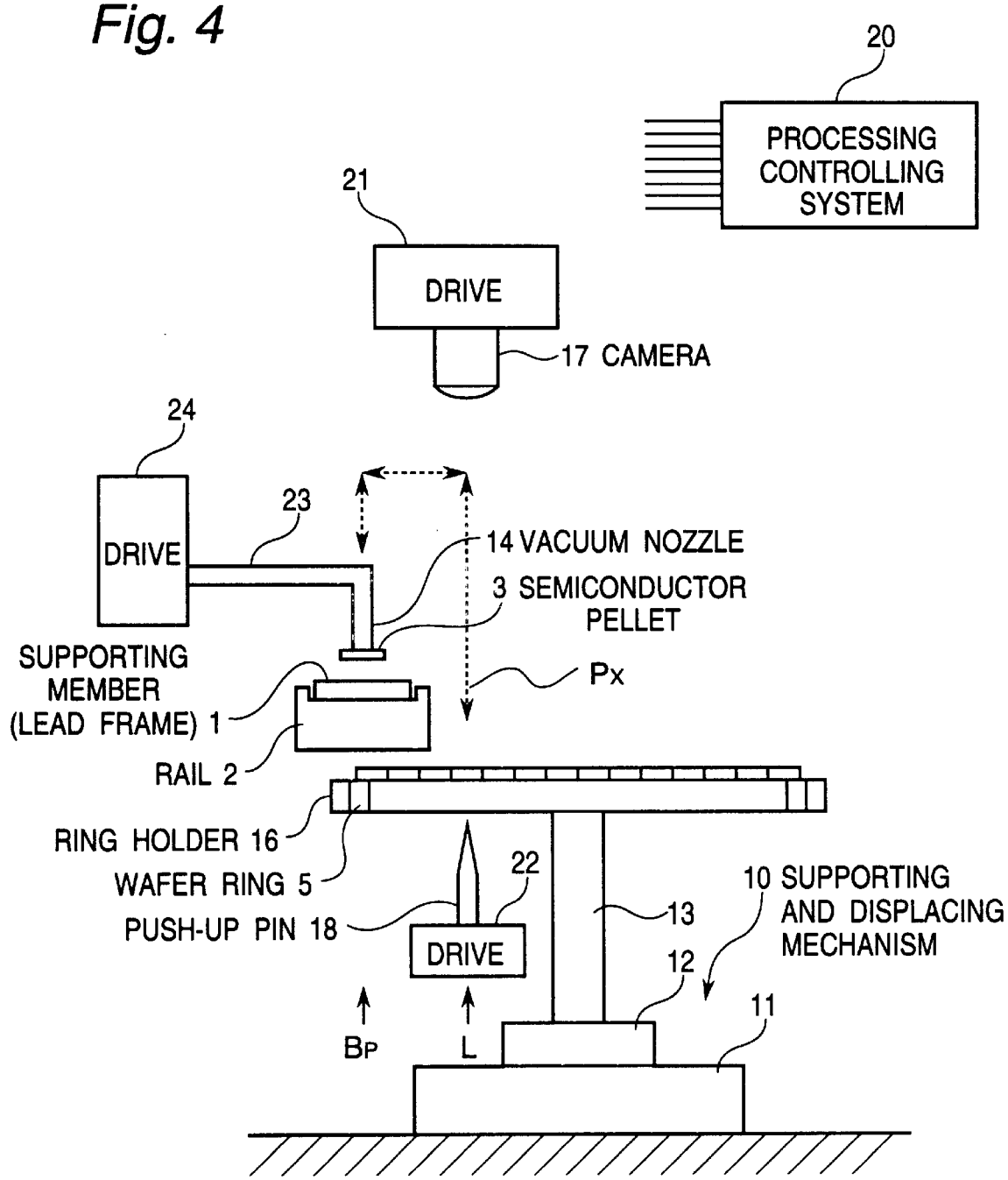
FIG. 4 is a diagrammatic side sectional view of the mechanism shown in FIG. 3.

Referring to FIG. 3, there is shown a diagrammatic plan view of a first embodiment of the die-bonding machine in accordance with the present invention. FIG. 4 is a diagrammatic side sectional view of the mechanism shown in FIG. 3.

As shown in FIGS. 3 and 4, the die-bonding machine includes a rail 2 extending in a horizontal direction in FIG. 3, and a supporting member 1 such as a lead frame having a series of lands 1a (on which a bonding agent such as a solder or a silver (Ag) paste was placed in a preceding step), is placed on the rail 2, and is intermittently fed by a land interval in a left-to-right direction in FIG. 3 (namely, in an X direction) and then slopped by a not-shown feeding mechanism so that the land is placed at a predetermined bonding position BP.

On the other hand, a number of pellets 3 obtained by dicing a wafer are adhered on a sheet (not shown) to maintain a geometrical arrangement before the wafer is divided into the pellets, and the sheet is fixed to a wafer ring 5. The wafer ring 5 is fitted into and held by a ring holder 16, which is supported by a supporting and displacing mechanism 10, as shown in FIG. 4. This supporting and displacing mechanism 10 includes an XY table 11 and a rotating mechanism 12 fixed on the XY table 11 and having a rotating shift 13 supporting the ring holder 16 secured to its top end. Therefore, the ring holder 16 can be rotated about a center axis of the rotating shaft 13 by means of the rotating mechanism 12. The XY table 11 is coupled to an X-direction driving mechanism 11A for displacing the ring holder 16 in the X direction in parallel to the feeding direction of the supporting member 1. The XY table 11 is also coupled to a Y-direction driving mechanism 11B for displacing the ring holder 16 in a Y direction perpendicular to the X direction. The center axis of the rotating shaft 13 is perpendicular to the X direction and the Y direction. Therefore, the supporting and displacing mechanism 10 can freely displace the ring holder 6 in the X direction, in the Y direction perpendicular, and in an angular direction (a θ direction), so that a designated pellet is sequentially placed in a pick-up position PX one by one. This pick-up position PX is determined to be as near to the bonding position BP as possible in the Y direction.

Figure 1:
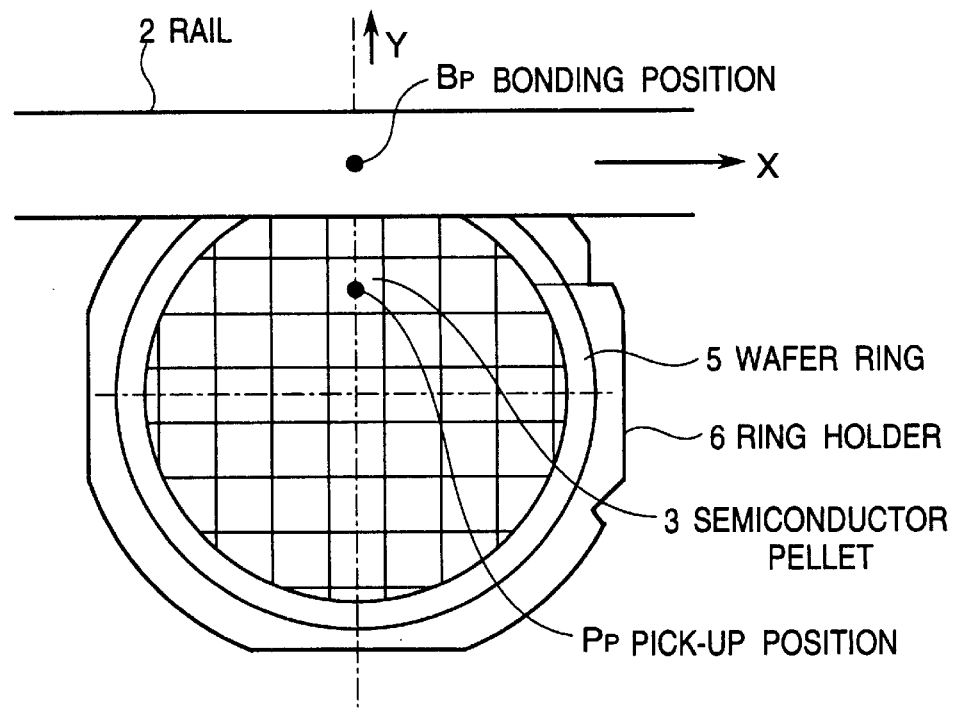
FIG. 1 is a diagrammatic partial plan view for illustrating the relation between a semiconductor wafer and a mechanism for feeding a supporting member such as a lead frame.
Figure 2:
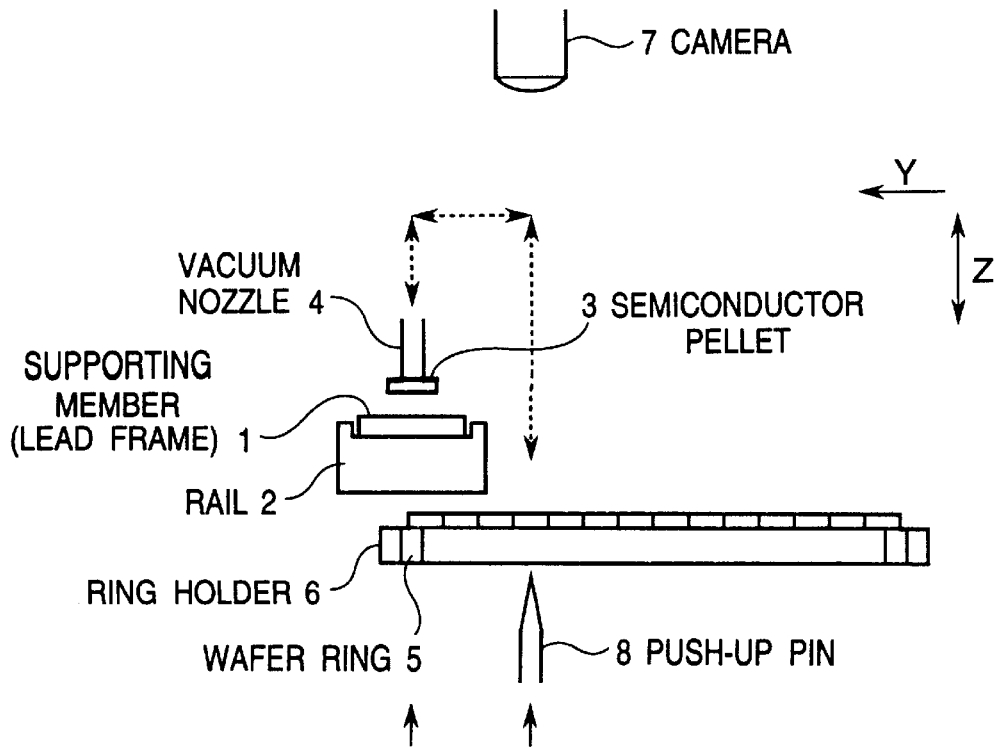
FIG. 2 is a diagrammatic side sectional view of the mechanism shown in FIG. 1.

The above construction is similar to the prior art die-bonding machine shown in FIGS. 1 and 2. However, the moving range of the ring holder 16 in the X direction is made smaller than that of the prior art die-bonding machine shown in FIGS. 1 and 2. The moving range of a center point C of the ring holder 16 is the same at opposite sides of a reference line S which is a Y axis line passing through the die-bonding position BP on the rail 2.

Furthermore, a moving line L of the pick-up position PX extending in the X direction is set to be as near to the die-bonding position BP as possible. However, a minimum distance is required between the die-bonding position BP and the pick-up position PX, by considering the size of the pellet to be picked up, a locating space for a sensor for confirming that the pellet is sucked to a vacuum nozzle in the pellet picking-up and carrying process, etc.

A camera 17 is located directly above the pick-up position PX, and an image of the pellet located on the pick-up position PX, is photographed by the camera 17 and processed by a processing and controlling system 20 to ascertain whether or not a bad mark exists in a target pellet, and whether or not an appearance abnormality such as a crack or a chipping exists in the target pellet, and also to confirm that the target pellet is positioned in place on the pick-up position PX. On the other hand, a push-up pin 18 is provided under the ring holder 6, in a substantial alignment with the camera 17 in a vertical line. When the pellet is picked up, the push-up pin 18 is elevated to push up the pellet positioned on the pick-up position PX, so as to peel off the pellet from the adhering sheet. Therefore, the camera 17 and the push-up pin 18 are fixed in the Y direction, but are movable in the X direction to displace the pick-up position PX in accordance with a rule which will be explained hereinafter.

For this purpose, the camera 17 is coupled to a driving mechanism 21 to be displaced along the moving line L of the pick-up position PX, and the push-up pin 18 is coupled to a driving mechanism 22 to be displaced along the moving line L of the pick-up position PX, in synchronism with the displacement of the camera, and to be moved vertically, namely, in the Z direction, for pushing up the pellet positioned on the pick-up position PX.

The die-bonding machine also includes a pellet picking-up and carrying mechanism having a vacuum nozzle 14. The vacuum nozzle 14 is fixed to a tip end of an arm 23 having a base end coupled to a driving mechanism 24. By this driving mechanism 24, the vacuum nozzle 14 can be displaced in the Z direction (vertical direction) and in the Y direction, shown in a dotted line in FIG. 4 and also in the X direction in FIG. 3. The supporting and displacing mechanism 10 and the drive mechanisms 21, 22 and 24 are controlled by the processing and controlling system 20

Now, an operation and a method for determining the pick-up position PX will be described. However, for convenience of description, the operation will be not necessarily described in the order of operation.

(1) After the wafer ring 5 holding a number of pellets arranged on the adhering sheet is set in the ring holder 16, the ring holder 16 is rotated to make the array of pellets 3 in parallel to the X direction and the Y direction, since the moving line L of the pick-up position PX is in parallel to the X direction.

(2) Pellet arrangement pitches 1X and 1Y are given in the X direction and in the Y direction in the array of pellets 3, respectively.

(3) The ring holder 16 is displaced in the X direction and in the Y direction in order to locate any pellet, a pellet to be first picked up, at a reference position (for example, a center point) within a viewing field of the camera 17. In this operation, when the ring holder 16 is displaced in the Y direction, the camera 17 is not displaced in the Y direction, but when the ring holder 16 is displaced in the X direction, the camera 17 is displaced in a −X direction, so as to approach the target pellet to be picked up. Here, the ring holder 16 and the camera 17 are displaced while maintaining such a relation that the X-direction coordinate position PX of the camera 17 and the X-direction coordinates CX of the center point C of the ring holder 16 fulfills the following equation:

$$PX = -A \cdot CX/(1-A) \quad (3)$$

where PX and CX are the X-direction coordinates when the reference line S is considered as being the origin of the coordinate axes, and "A" is a positive number less than 1. This "A" is determined dependently upon an individual machine. For simplification, assuming that "A" is ½, the equation (3) can be converted as follows:

$$PX = -CX \quad (4)$$

Here, to follow the displacement of the camera 17, the push-up pin 18 is displaced to the same position in the XY coordinates.

If the first pellet is precisely positioned as mentioned above, the position of the first pellet 3 in relation to the ring holder 16 can be known from the displacements of the ring holder 16 and the camera 17. In addition, the arrangement of the array of pellets can be supposed from the pitches 1X and 1Y.

Figure 5:
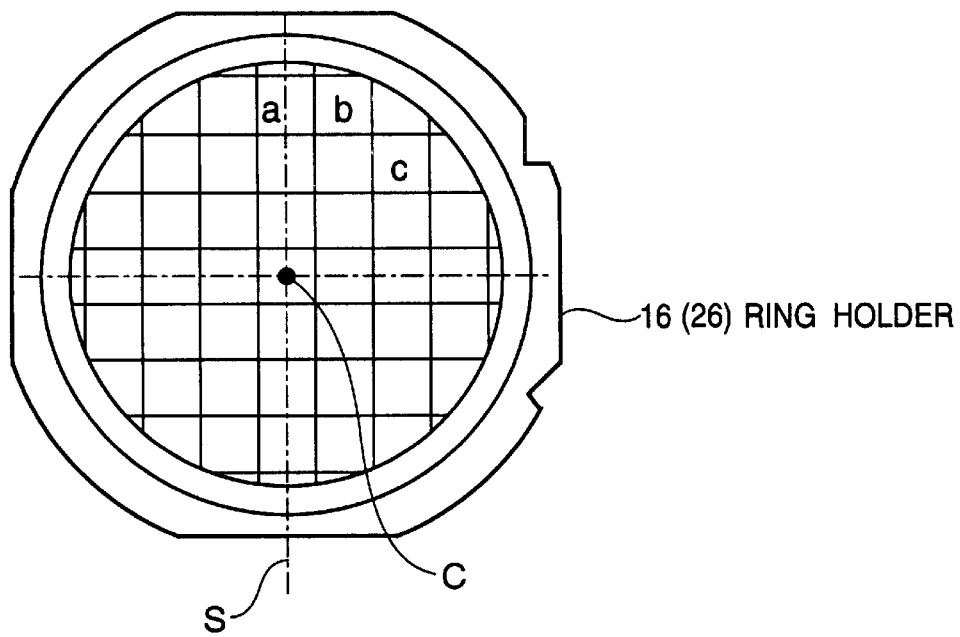
FIG. 5 diagrammatically illustrate the array of pellets held by a ring holder.

(4) For simplification of description in the array of pellets as shown in FIG. 5, it is assumed that a center of a central pellet in the array of pellets is consistent with the center point C of the ring holder 16, and the pellet "a" to be first picked up is included in a central column of pellets having a center line positioned on the Y axis passing through the center point C of the ring holder 16. Under this condition, when the pellet "a" is positioned on the reference point within the viewing field of the camera 17, the pellet "a" is on the pick-up line L and has the X-coordinate position of "0" (namely, on the reference line S). This point becomes a first pick-up position. In this condition, an automatic operation is started, and if the pellet "a" is non-defective as the result of the image processing, the vacuum suction nozzle 14 is moved in the X, Y and Z directions, so that the pellet "a" is picked up, and carried to the die-bonding position BP, and then, placed on the land of the supporting member 1 positioned on the die-bonding position BP. In this operation, when the pellet "a" is picked up, the push-up pin 18 is elevated to push up the pellet "a" so as to assist the peeling-off of the pellet from the adhering sheet (not shown).

(5) After the pellet "a" is picked up, the pick-up position PX (the position of the camera 17 and the push-up pin 18) is displaced by "1X/2". Interlocking with this displacement of the pick-up position PX, the ring holder 16 is displaced by "−1X/2". As a result, a pellet "b" is located within the viewing field of the camera 17. However, since the pellet "b" shown in FIG. 5 is not a rectangle (because one corner is chipped), the pellet "b" is not picked up, and the pick-up position PX is further displaced by "−1X/2", and the ring holder 16 is further displaced by "−1X/2" interlocking with this further displacement of the pick-up position PX. However, the pellet adjacent to the pellet "b" in the X direction is also not a rectangle, and therefore, the pellet is not picked up, aid the pick-up position PX is further displaced.

(6) If a non-rectangular pellet and/or a no-pellet condition continue to occur a predetermined number of times, a row is changed. Namely, the ring holder 16 is displaced by "1Y" in the Y direction while maintaining the X-direction pick-up position PX as it is. In this condition, if no pellet is detected on the pick-up position PX, the pick-up position PX is displaced by "−1X/2" and the ring holder 16 is displaced by "1X/2", interlocking with this further displacement of the pick-up position PX. If the pellet on the new pick-up position is not a rectangle, the pellet is not picked up, and the pick-up position PX is further displaced by "−1X/2" and the ring holder 16 is further displaced by "1X/2", interlocking with this further displacement of the pick-up position PX, so that a pellet "c" is located within the viewing field of the camera 17.

(7) The position of the pellet "c" and whether or not the pellet "c" is detective is ascertained by image processing. If the pellet "c" is non-defective, only the ring holder 16 is finally position-adjusted in the X, Y and θ directions on the basis of the position ascertainment data, without displacing the pick-up position, and then, the position ascertainment is carried out again. If necessary, the fine adjustment of the position is carried out, and after a precise positioning can be obtained, the pellet "c" is picked up by the vacuum suction nozzle 14 for locating the pellet "c" on the die-bonding position BP.

(8) After the pellet "c" is picked up, the pick-up position PX is displaced by "−1X/2", and the ring holder 16 is displaced by "1X/2", interlocking with the displacement of the pick-up position PX.

(9) The above mentioned operation is repeated for all the pellets. Namely, the pick-up position PX is reciprocated while displacing with the pitch of "1X/2", and on the other hand, a new pellet is positioned to the pick-up position PX displaced with the pitch of "1X/2", so that the defective pellet is left and the non-defective pellet is picked up and placed on the predetermined die-bonding position BP.

In the above mentioned die-bonding machine, since the Y direction distance between the die-bonding position BP and the moving line L of a pick-up position PX is made as short as possible, the time for carrying the pellet in the Y direction is shortened. On the other hand, the X-direction pellet carrying distance is generated, which however becomes one fourth of the diameter of the wafer (the diameter of the array of pellets) at maximum. Therefore, the die-bonding operation is somewhat lowered in comparison with the prior art die-bonding machine shown in FIGS. 1 and 2. Furthermore, the moving range of the ring holder 16 in the Y direction becomes a double of the diameter of the wafer, similarly to the prior art die-bonding machine shown in FIGS. 1 and 2, but the moving range of the ring holder 16 in the X direction becomes one and a half times the diameter of the wafer. Correspondingly, the machine can be reduced in size As mentioned above, in the first embodiment, by displacing the pick-up position PX in the X direction, the moving range of the ring holder 16 in the X direction is made smaller than that in the prior art die-bonding machine. A second embodiment, which will be described hereinafter, is so configured that, by displacing a pick-up position PXY in the X direction and in the Y direction, the moving range of the ring holder 16 is made smaller than that in the prior art die-bonding machine not only in the X direction but also in the Y direction.

Figure 6:
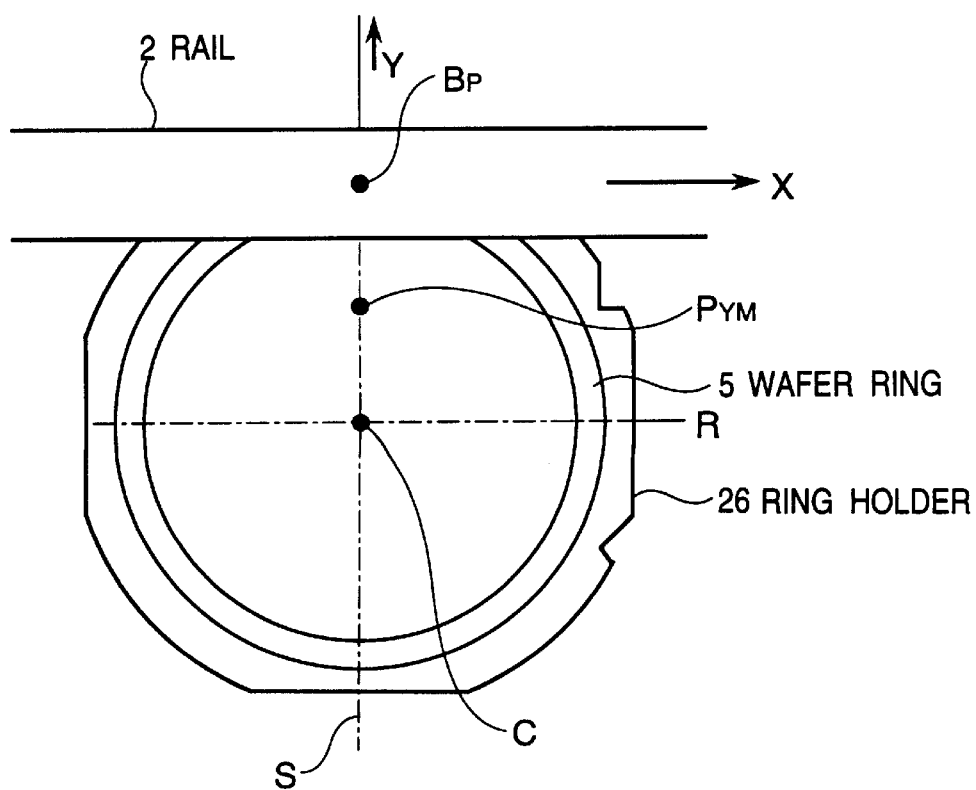
FIG. 6 is a diagrammatic partial plan view of a second embodiment of the die-bonding machine in accordance with the present invention.

Referring to FIG. 6, there is shown a diagrammatic partial plan view of the second embodiment of the die-bonding machine in accordance with the present invention. This second embodiment is similar to the first embodiment in that the moving range of a center point C of a ring holder 26 is the same at opposite sides of a reference line S which is a Y-axis line passing through a die-bonding position BP on the rail 2. However, the second embodiment has the moving range of the same magnitude at opposite sides of a reference line R extending in the X direction. This reference line R is determined in such a manner that when an intersection of the reference line S and the reference line R is positioned on a center point of the ring holder 26, a ½-radius position of the wafer (the array of pellets) held by the ring holder 26 is as near to the die-bonding position BP as possible on the reference line S and is at a position which slightly apart from a point PYM which can become a pick-up position, toward the intersection of the reference line S and the reference line R.

The second embodiment can be realized by slightly modifying the die-bonding machine shown in FIGS. 3 and 4, and by controlling the machine in a different manner. As a result, as mentioned above, the pick-up position PXY is movable both in the X direction and in the Y direction, and therefore, the camera 17 and the push-up pin 18 are also movable both in the X direction and in the Y direction. In addition, the vacuum nozzle 14 provided at a tip end of the pellet picking-up and carrying mechanism can be displaced in the X, Y and Z directions, so that the pellet is picked up at the pick-up position PXY, and carried to the die-bonding position BP, and then, placed on the land of the supporting member in the pick-up position PXY, for a die-bonding.

Now, an operation and a method for determining the pick-up position PXY will be described. However, for convenience of description, the operation will be not necessarily described in the order of operation.

(1) After the wafer ring 5 holding a number of pellets arranged on the adhering sheet is set in the ring holder 26, the ring holder 26 is rotated to make the array of pellets 3 in parallel to the X direction and the Y direction. In addition, pellet arrangement pitches 1X and 1Y are provided in the X direction and in the Y direction in the array of pellets 3, respectively. Furthermore, the ring holder 26 is displaced in the X direction and in the Y direction in order to locate any pellet, a pellet to be first picked up, at a reference position (for example, a center point) within a viewing field of the camera 17. The operation until this point is similar to that of the first embodiment.

(2) In this embodiment, when the ring holder 26 is displaced in the X direction and in the Y direction, the camera 17 is displaced in a −X direction and in a −Y direction, so as to approach the target pellet to be picked up. Here, the ring holder 26 and the camera 17 are displaced while maintaining such a relation that the coordinates positions PX and PY of the camera 17 and the coordinates CX and CY of the center point C of the ring holder 26 fulfills the following equation:

$$PX = -A \cdot CX / (1-A) \tag{3}$$

$$PY = -B \cdot CY / (1-B) \tag{3A}$$

where PX and PY are an X coordinate position and a Y coordinate position of the camera when the intersection between the reference line R and the reference line S is considered as being the origin of the coordinate axes, CX and CY are an X coordinate position and a Y coordinate position of the center point C of the ring holder 26 when the intersection between the reference line R and the reference line S is considered as being the origin of the coordinate axes, and "A" and "B" is positive numbers less than 1. These "A" and "B" values are determined dependent upon an individual machine. For simplification, assuming that "A" and "B" are ½, the equations (3) and (3A) can be converted as follows:

$$PX = -CX \tag{4}$$

$$PY = -CY \tag{4A}$$

Here, to follow the displacement of the camera 17, the push-up pin 18 is displaced to the same position in the XY coordinates.

If the first pellet is precisely positioned as mentioned above, the position of the first pellet 3 in relation to the ring holder 26 can be known from the displacements of the ring holder 26 and the camera 17. In addition, the arrangement of the array of pellets can be supposed from the pitches 1X and 1Y.

(5) For simplification of description in the array of pellets as shown in FIG. 5, it is assumed that a center of a central pellet in the array of pellets is (consistent with the center point C of the ring holder 26, and the pellet "a" to be first picked up is included in a central column of pellets having a center line positioned on the Y axis passing through the center point C of the ring holder 26. Under this condition, when the pellet "a" is positioned on the reference point within the viewing field of the camera 17, the pellet "a" is on the reference line S. This point becomes a first pick-up position. In this condition, an automatic operation is started, and if the pellet "a" is non-defective as the result of the image processing, the vacuum suction nozzle 14 is moved in the X, Y and Z directions, so that the pellet "a" is picked up, and carried to the die-bonding position BP, and then, placed on the land of the supporting member 1 positioned on the die-bonding position BP. In this operation, when the pellet "a" is picked up, the push-up pin 18 is elevated to push up the pellet "a" so as to assist the peeling-off of the pellet from the adhering sheet (not shown).

(4) After the pellet "a" is picked up, the pick-up position PXY (the position of the camera 17 and the push-up pin 18) is displaced by "1X/2" in the X coordinates, without changing the pick-up position PXY in the Y coordinates. Interlocking with this displacement of the pick-up position PXY, the ring holder 26 is displaced by "−1X/2" in the X coordinates, without changing the center position CXY of the ring holder 26 in the Y coordinates. As a result, a pellet "b" is located within the viewing field of the camera 17. However, since the pellet "b" shown in FIG. 5 is not a rectangle (because one corner is chipped), the pellet "b" is not picked up, and the pick-up position PXY is further displaced by "1X/2" and the ring holder 26 is further displaced by "−1X/2", interlocking with this further displacement of the pick-up position PXY. However, the pellet adjacent to the pellet "b" in the X direction is also not a rectangle, and therefore, the pellet is not picked up, and the pick-up position PXY is further displaced.

(6) If a non-rectangular pellet and/or a no-pellet condition continue a predetermined number of times, a row is changed. Namely, the pick-up position PXY is displaced by "−1X/2" in the Y direction without being displaced in the X direction, and the ring holder 26 is displaced by "1X/2" in the Y direction without being displaced in the X direction, interlocking with the displacement of the pick-up position PXY. In this condition, if no pellet is detected on the new pick-up position PXY, the pick-up position PXY is displaced by "−1X/2" without being displaced in the Y direction, and the ring holder 26 is displaced by "1X/2" without being displaced in the Y direction, interlocking with the displacement of the pick-up position PXY. If the pellet on the new pick-up position is not a rectangle, the pellet is not picked up, and the pick-up position PXY is further displaced by "−1X/2" without being displaced in the Y direction, and the ring holder 26 is further displaced by "1X/2" without being displaced in the Y direction, interlocking with the displacement of the pick-up position PXY, so that a pellet "c" is located within the viewing field of the camera 17.

(6) The position of the pellet "c" and whether or not the pellet "c" is defective is ascertained by the image processing. If the pellet "c" is non-defective, only the ring holder 26 is finally position-adjusted in the X, Y and θ directions on the basis of the position ascertainment data, without displacing the pick-up position, and then, the position ascertainment is carried out again. If necessary, the fine adjustment of the position is carried out, and after a precise positioning can be obtained, the pellet "c" is picked up by the vacuum suction nozzle 14 for locating the pellet "c" on the die-bonding position BP.

(7) After the pellet "c" is picked up, the pick-up position PXY is displaced by "−1X/2" without being displaced in the Y direction, and the ring holder 26 is displaced by "1X/2" without being displaced in the Y direction, interlocking with the displacement of the pick-up position PXY.

(8) The above mentioned operation is repeated for all the pellets. Namely, the pick-up position PXY is displaced with the pitch of "1X/2", and if the pick-up position PXY reaches an end in the X direction, the change of the row is carried out by displacing the pick-up position PXY with the pitch of "1Y/2", and then, the pick-up position PXY is displaced with the pitch of "−1X/2". In this operation, the defective pellet is left and the non-defective pellet is picked up and placed on the predetermined disbonding position BP.

In the second embodiment of the die-bonding machine as mentioned above, since the distance between the die-bonding position BP and the pick-up position PXY becomes long, the time for carrying the pellet becomes long to some degree. However, since the moving range of the ring holder 26 becomes one and a half times the diameter of the wafer both in the X direction and in the Y direction. Correspondingly, the machine can be reduced in size In the above mentioned embodiments, "A"="B"=½. However, it would be apparent to persons skilled in the art that the value of each of "A" and "B" can be freely determined if necessary.

As seen from the above, since the die-bonding machine in accordance with the present invention can make the moving range of the pellet supporting and displacing mechanism as small as possible without seriously lowering the speed of the die-bonding operation, the size of the die-bonding machine can be reduced. In addition, since the die-bonding operation is performed by repeatedly executing the same operation, the control software can be simplified.

The invention has thus been shown and described with reference to the specific embodiments. However, it should be noted that the present invention is in no way limited to the details of the illustrated structures but changes and modifications may be made within the scope of the appended claims.

What is claimed is:

1. A die-bonding machine for picking up a number of semiconductor pellets arranged in the form of a pellet array, one by one, to place a picked-up semiconductor pellet on a predetermined position, the die-bonding machine comprising:

a pellet supporting and displacing mechanism for supporting said number of semiconductor pellets arranged in the form of the pellet array, and for displacing said number of semiconductor pellets arranged in the form of the pellet array, in an X direction and in a Y direction; and a pellet picking-up and carrying mechanism having a pellet sucking means which can be displaced in the X direction, in the Y direction and in a Z direction, for picking up one semiconductor pellet positioned on a pick-up position, from said number of semiconductor pellets supported by said pellet supporting and displacing mechanism, and for placing the picked-up semiconductor pellet on said predetermined position, said pick-up position being movable only in the X direction, wherein a center point of said pellet supporting and displacing mechanism is the origin of the coordinates in the X direction, wherein an X-direction coordinate position of the semiconductor pellet to be picked up in relation to said pellet supporting and displacing mechanism is "x", and wherein a center position of an X-direction moving range of said pellet supporting and displacing mechanism is the origin of the coordinates, wherein said pellet supporting and displacing mechanism and said pellet picking-up and carrying mechanism are displaced so that an X-direction coordinate position PX of said pick-up position takes a position expressed by a first equation, said first equation being "PX=Ax" and an X-direction coordinate position CX of said center point of said pellet supporting and displacing mechanism takes a position expressed by a second equation, said second equation being "CX=−(1−A)x, and wherein said A is a positive number less than 1.

2. The die-bonding machine claimed in claim 1, further including a position ascertaining means located above said pick-up position.

3. The die-bonding machine claimed in claim 1, further including a push-up pin located under said pick-up position.

4. The die-bonding machine claimed in claim 1, wherein "A"=½.

5. A die-bonding machine for picking up a number of semiconductor pellets arranged in the form of a pellet array, one by one, to place a picked-up semiconductor pellet on a predetermined position, the die-bonding machine comprising:

a pellet supporting and displacing mechanism for supporting said number of semiconductor pellets arranged in the form of the pellet array, and for displacing said number of semiconductor pellets arranged in the form of the pellet array, in an X direction and in a Y direction; and a pellet picking-up and carrying mechanism having a pellet sucking means which can be displaced in the X direction, in the Y direction and in a Z direction, for picking up one semiconductor pellet positioned on a pick-up position, from said number of semiconductor pellets supported by said pellet supporting and displacing mechanism, and for placing the picked-up semiconductor pellet on said predetermined position, said pick-up position being movable in the X direction and in the Y direction, wherein a center point of said pellet supporting and displacing mechanism is the origin of the coordinates in the X direction and in the Y direction, wherein an X-direction coordinate position and a Y-direction coordinate position of the semiconductor pellet to be picked up in relation to said pellet supporting and displacing mechanism are "x" and "y", respectively, and wherein a center position of an X-direction and Y-direction moving range of said pellet supporting and displacing mechanism is the origin of the coordinates, wherein said pellet supporting and displacing mechanism and said pellet picking-up and carrying mechanism are displaced so that an X-direction coordinate position PX and a Y-direction coordinate position PY of said pick-up position take a position expressed by a first equation and a second equation, respectively, said first equation being "PX=Ax" and said second equation being "PY=By", and an X-direction coordinate position CX and a Y-direction coordinate position CY of said center point of said pellet supporting and displacing mechanism take a position expressed by a third equation and a fourth equation, respectively, said third equation being "CX=−(1−A)x" and said fourth equation being "CY=−(1−B)y", A and B being positive numbers less than 1.

6. The die-bonding machine claimed in claim 5, further including a position ascertaining means located above said pick-up position.

7. The die-bonding machine claimed in claim 5, further including a push-up pin located under said pick-up position.

8. The die-bonding machine claimed in claim 5, wherein "A"="B"=½.

9. The die-bonding machine claimed in claim 1, wherein said predetermined position on which the semiconductor pellet is placed comprises a die bonding position.

10. The die-bonding machine claimed in claim 5, wherein said predetermined position on which the semiconductor pellet is placed comprises a die bonding position.

11. The die-bonding machine claimed in claim 1, wherein said predetermined position on which the semiconductor pellet is placed comprises a relay position for precision positioning.

12. The die-bonding machine claimed in claim 5, wherein said predetermined position on which the semiconductor pellet is placed comprises a relay position for precision positioning.

13. The die-bonding machine claimed in claim 1, wherein said pellet supporting and displacing mechanism comprises a rotating mechanism for adjusting an angular position of the semiconductor pellets.

14. The die-bonding machine claimed in claim 5, wherein said pellet supporting and displacing mechanism comprises a rotating mechanism for adjusting the direction of the semiconductor pellets.

15. The die-bonding machine claimed in claim 1, further comprising a discriminating means for detecting defective pellets.

16. The die-bonding machine claimed in claim 5, further comprising a discriminating means for detecting defective pellets.

17. A die-bonding machine for selectively placing one of a plurality of semiconductor pellets on a predetermined position, comprising:

- a pellet supporting and displacing mechanism for supporting said number of semiconductor pellets arranged in the form of a pellet array, and for displacing said number of semiconductor pellets arranged in the form of the pellet array, in an X direction and in a Y direction; and
- a pellet picking-up and carrying mechanism having a suctioning device, for picking up one pellet on a pick-up position, from said plurality of semiconductor pellets supported by said pellet supporting and displacing mechanism, and for placing said one semiconductor pellet on said predetermined position wherein a center point of said pellet supporting and displacing mechanism is the origin of at least one of a coordinate in the X direction and one of a coordinate in the Y direction, wherein at least one of an X-direction coordinate position and a Y-direction coordinate position of the semiconductor pellet to be picked up in relation to said pellet supporting and displacing mechanism is at least one of "x" and "y", and wherein a center position of at least one of an X-direction and Y-direction moving range of said pellet supporting and displacing mechanism is the origin of the coordinates, and wherein said pellet supporting and displacing mechanism and said pellet picking-up and carrying mechanism are displaced so that at least one of an X-direction coordinate position and a Y-direction coordinate position of said pick-up position take a position, wherein said X-direction coordinate position PX of said pick-up position takes a position expressed by a first equation being "PX=Ax" and an X-direction coordinate position CX of said center point of said pellet supporting and displacing mechanism takes a position expressed by a second equation, said second equation being "CX=−(1−A)", where A is a positive number less than 1.

18. The die-bonding machine, as claimed in claim 17, wherein said suctioning device is displaceable in at least one of the X direction, in the Y direction, and in a Z direction, and wherein said pick-up position is movable in at least one of the X direction and in the Y direction.

19. The die bonding machine, as claimed in claim 17, wherein said pellet supporting and displacing mechanism and said pellet picking-up and carrying mechanism are displaced so that a Y-direction coordinate position of said pick-up position takes a position, wherein said Y-direction coordinate position PY of said pick-up position takes a position expressed by a third equation, said third equation being "PY=By" and an Y-direction coordinate position CY of said center point of said pellet supporting and displacing mechanism takes a position expressed by a fourth equation, said fourth equation being "CY=−(1−B)y", where B is a positive number less than 1.

* * * * *